United States Patent [19]

Polacek

[11] Patent Number: 4,706,602

[45] Date of Patent: Nov. 17, 1987

[54] SOLDER COATER BOARD CLAMP

[75] Inventor: Richard Polacek, Santa Barbara, Calif.

[73] Assignee: Gyrex Corporation, Santa Barbara, Calif.

[21] Appl. No.: 913,620

[22] Filed: Sep. 30, 1986

Related U.S. Application Data

[63] Continuation of Ser. No. 813,796, Dec. 27, 1985, abandoned.

[51] Int. Cl.$^4$ .......................... B05C 3/10; B05C 11/06; B05C 13/02
[52] U.S. Cl. ...................................... 118/63; 188/425; 188/503; 269/272; 269/238; 269/254 CS; 269/46
[58] Field of Search .................. 269/272, 238, 254 CS, 269/46; 118/425, 503, 63, 64

[56] References Cited

U.S. PATENT DOCUMENTS

| | | | |
|---|---|---|---|
| 3,756,852 | 9/1973 | Scheetz et al. | 118/425 X |
| 3,865,298 | 2/1975 | Allen et al. | 118/63 |
| 4,072,777 | 2/1978 | Schoenthaler | 118/63 X |
| 4,083,323 | 4/1978 | Rote | 118/425 X |
| 4,534,843 | 8/1985 | Johnson et al. | 118/423 X |

Primary Examiner—John P. McIntosh
Attorney, Agent, or Firm—Arthur J. Plantamura

[57] ABSTRACT

A clamp for dipping printed circuit boards into a solder bath of a solder coater machine is disclosed. The clamp comprises first and second interdigitated, coplanar fingers connected respectively at common ends thereof to a pair of spaced, parallel first and second plates. Pivot pins respectively connect adjacent first and second fingers to each other to define a pivot axis extending parallel to and between the distal ends of fingers and the first and second plates. The second plate is spring biased from and movable towards the first plate under an applied actuating force to pivot the second fingers out the plane of the first fingers enabling insertion of a printed circuit board between clamping surfaces defined by the distal ends. The pivot pins and spring mechanism are spaced a sufficient distance from the distal ends to avoid contamination by solder particles and flux during the coating process and to avoid interference with air leveling knives closely spaced to the coated board upon removal from the bath.

14 Claims, 7 Drawing Figures

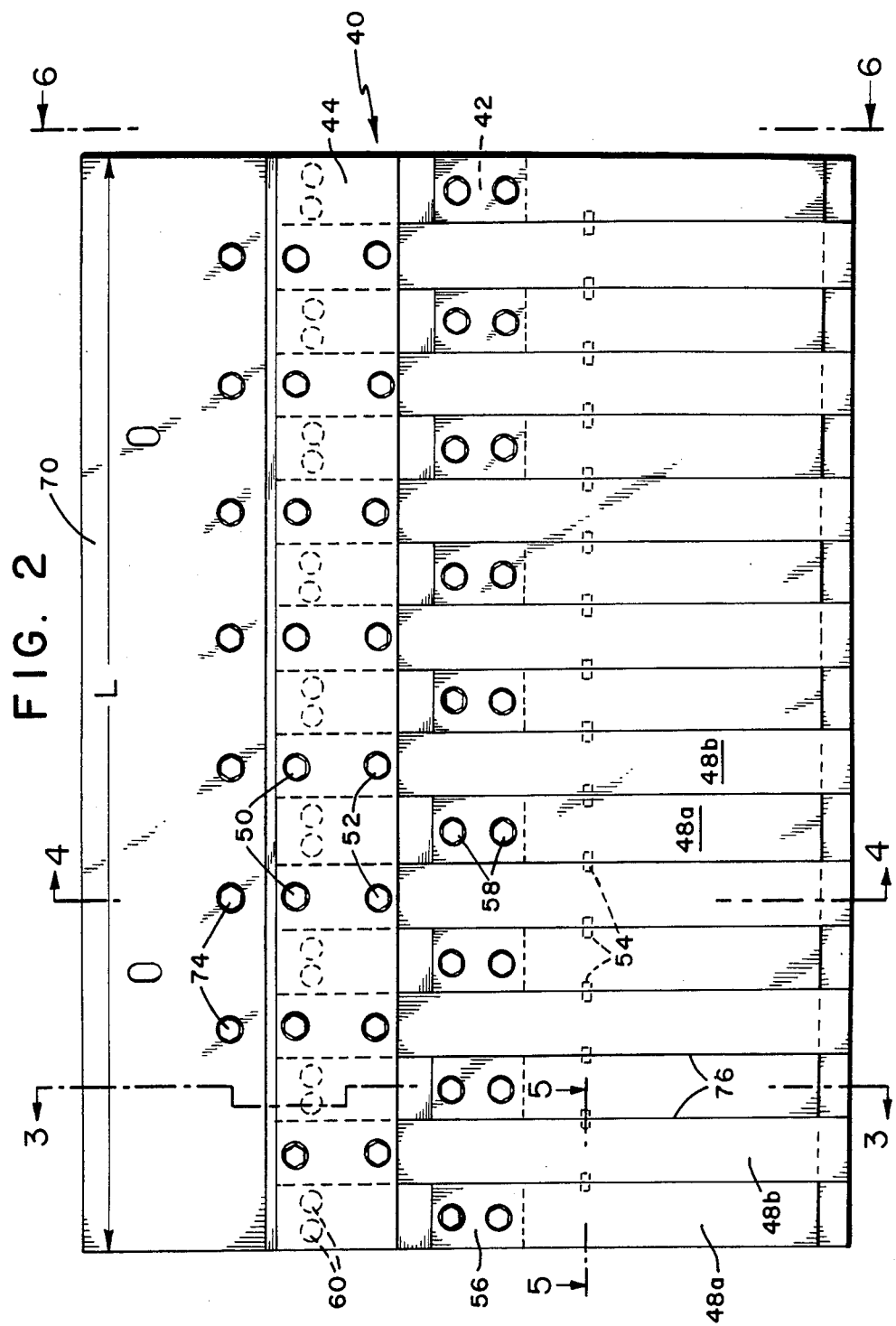

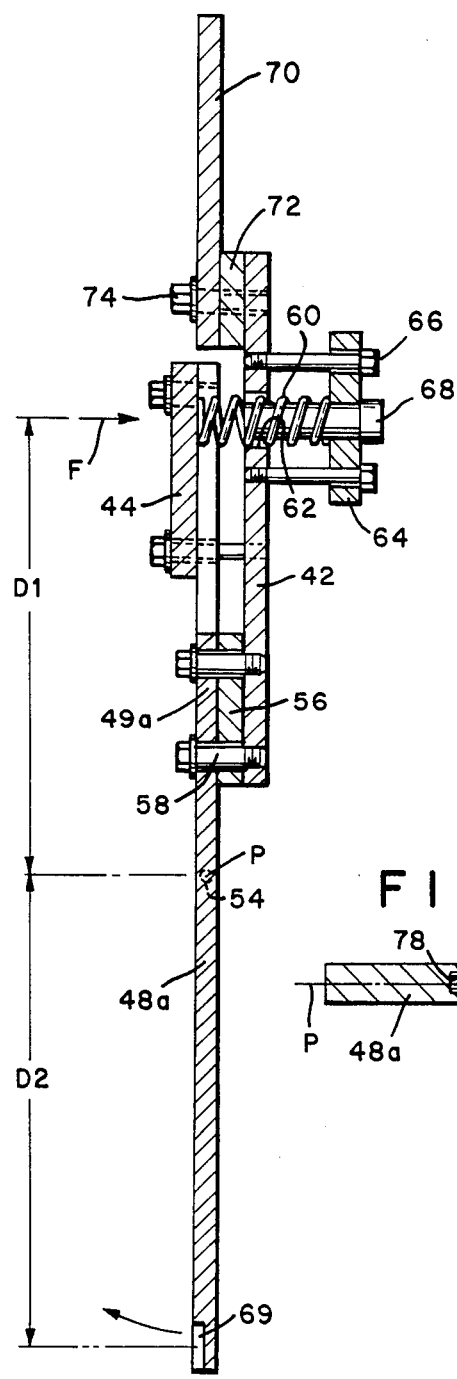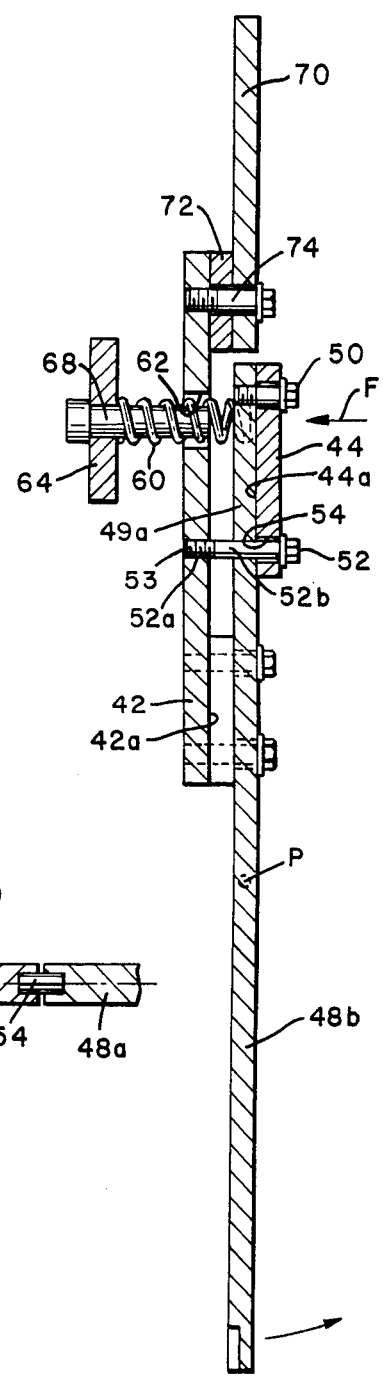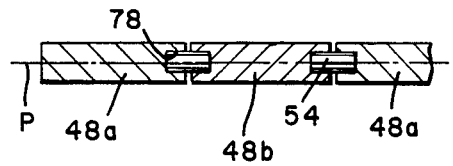

SOLDER COATER BOARD CLAMP

This application is a continuation of application Ser. No. 813,796 filed Dec. 27, 1985 now abandoned.

DESCRIPTION

1. Technical Field

The present invention relates generally to devices used to clamp boards for movement between working stations and, more particularly, to a board clamp on a solder coater used for dipping a printed circuit board into a liquid solder bath.

2. Background Art

In the manufacture of printed circuit boards (hereinafter PCB), solder coating machines are employed to coat the board with a layer of solder by dipping the PCB into a liquid solder bath. One type of coating machine is disclosed in U.S. Pat. No. 3,865,298 to Allen et al, the disclosure of which is hereby incorporated by reference herein in its entirety.

As depicted in FIG. 1 of the present specification, the machine of the '298 patent includes a housing 10 containing a liquid solder bath 12, hot gas knives 14 disposed along guideways 16 and an inlet 16 formed in housing top 19 through which a fluxed PCB descends along the guideways into contact with the liquid solder. As the board is withdrawn from bath 12, hot gas under pressure flowing out of knives 14 onto the PCB sweeps off undesired solder, leaving an optimum thickness solder layer. During this solder leveling step, the outlets 14a of the knives 14 are maintained closely spaced to the PCB to ensure that the PCB passes through a point of maximum concentration of the blast of hot gases ejected from the knives.

The PCB may be formed with an edge, later trimmed, used to lower the PCB into bath 12 by the use of suitable clamps. Generally speaking, these clamps include a pair of parallel clamping plates connected together by a bulky opening and closing spring or cam operated mechanism mounted on the plates in close proximity to parallel clamping edges thereof to ensure maximum concentration of clamping force applied to these edges. While in clamping contact with the PCB, the clamp is lowered through housing top 19 to dip the PCB into bath 12. The clamping edges are often dipped into the bath to ensure complete immersion of the PCB.

Since the major axis of the opening and closing mechanism is situated perpendicular to the plane of the clamping plate, the clamp is rather bulky and tends to prevent the leveling knives 14 from being disposed closely adjacent the PCB. Thus, expensive and complicated mechanisms are often required to move the knives toward and away from the PCB to ensure unobstructed passage of the clamp along guideways 16. Too, solder tends to build up between the clamping edges preventing them from closing to securely clamp the PCB. The clamp opening and closing mechanism tends to get contaminated with solder and flux, resulting in unreliable operation. Down time often occurs as the clamp is either repaired or replaced.

The foregoing prior art clamps tend to be narrow in width which may require close fitting parts that can be contaminated with flux and solder particles and rendered inoperative. In addition, the narrow width of the clamp allows only one board at a time to be dipped into solder, thus slowing production.

It is accordingly one object of the present invention to provide an improved clamp with board clamping members arranged to minimize the tendency of solder to adhere to these members.

Another object of the invention is to provide a clamp having an opening and closing mechanism disposed at one end of the clamp opposite the clamping members to prevent contamination by flux and solder particles and above the air knives to prevent interference therewith.

Yet another object is to provide a clamp wherein the clamping members are relatively thin allowing the air knives to be maintained in close proximity to the clamped board.

Yet a further object is to provide a clamp allowing plural boards to be clamped and dipped into solder simultaneously to increase production.

Another object is to provide a clamp eliminating the need for expensive close fitting parts and one that is capable of use in rugged and hostile environments.

DISCLOSURE OF THE INVENTION

A clamp, preferably for dipping a printed circuit board into a solder bath, in accordance with the present invention, comprises plural first and second fingers arranged on support members in interdigitated coplanar relationship to each other, with distal ends of the first and second fingers being generally aligned. The support members are arranged to allow movement of the second fingers relative to the first fingers, under the influence of an actuating force, to alternately displace the distal ends of the first and second fingers from each other in a direction generally perpendicular to the plane of the first and second fingers to allow for insertion and clamping of one or more printed circuit boards between the distal ends.

The first clamping fingers are preferably fixed to a first plate to project outwardly therefrom in laterally spaced and coplanar relationship with each other. A movable second plate is mounted to the first plate in spaced, substantially parallel relationship. A spring biases the second plate from the first plate. The second fingers are fixed to the second plate to extend respectively between and coplanar with the first clamping fingers. The first and second fingers are pivotally secured to each other, whereby movement of the second plate in a direction perpendicular to the plane of the first plate under the influence of an applied actuating force causes the second fingers to pivot out of the plane of the first fingers enabling insertion of the PCBs between the first and second fingers. Removal of the actuating force allows the second plate to move under spring bias causing the second fingers to pivot towards the first fingers and thereby clamp the PCB therebetween.

Preferably, a screw mounted spring support plate extends parallel to one surface of the first plate. The second plate extends parallel to the other side of the first plate. The spring passes through the first plate and includes opposite ends abutting against the spring support plate and second plate. One end of the spring is maintained in fixed position relative to the spring support plate by means of a centering pin extending from the support plate through the first plate. The spring preferably contacts the upper end of the movable second plate to maximize the distance between the spring and pivot axis passing through the first and second fingers between distal ends thereof and the spring.

The first fingers are preferably maintained in a plane parallel to the first plate by means of spacers. The use of spacers offsets the pivot axis from the plane of the first plate to allow the second fingers to pivot with respect to the first fingers upon the application of actuating force moving the second plate against spring bias towards the first plate. Guide pins passing through the first and second plates between the spring and spacers assist in supporting the second plate and movable fingers thereon relative to the first plate while allowing the second plate to slide along the guide pins during application of the actuating force depressing the second plate towards the first plate.

The pivot axis is preferably defined by a series of pivot pins respectively journalled in blind holes formed in lateral edges of the fingers facing each other. The pins are thereby isolated by the fingers from the external environment to prevent contamination by flux or solder particles. The ratio of the spacing between the spring and pivot axis relative to the distance between the pivot axis and distal or clamping edges of the fingers is calculated to obtain a minimum spring rate to thereby minimize actuator force and size and improve mechanical advantage while maintaining the pivot axis above the level of the air knives during operation. A preferred ratio is approximately 1 to 1.

By virtue of mounting the first and second fingers in staggered relationship to each other the contact surfaces between the first and second fingers is minimal, i.e., between the facing lateral edges of adjacent fingers, to prevent accumulation of solder between the clamping edges. To further minimize adhesion of solder to the fingers, the clamping edges thereof or the fingers may be formed of titanium or like material.

An upper end of the first plate projects above the second plate to provide connection of the clamp to a clamp holder mechanism through a connecting plate. The connecting plate is preferably mounted coplanar and above the first and second fingers through spacers so that the clamp holder mechanism, which may be a counterbalanced structural tubing frame assembly connected to a pneumatic cylinder, may raise and lower the clamp between upper and lower positions defined by limit switches.

The first and second fingers extend along the entire length of the first and second plates limited by the length of the inlet opening formed in the housing top of a solder coating machine. The clamp according to the present invention is thus capable of supporting plural boards between the fingers for simultaneous dipping into a solder bath, increasing production.

Still other objects and advantages of the present invention will become readily apparent to those skilled in this art from the following detailed description of the invention, wherein I have shown and described only the preferred embodiment of the invention, simply by way of illustration of the best mode contemplated by me of carrying out my invention. As will be realized, the invention is capable of modifications in various obvious respects, all without departing from the invention. Accordingly, the drawings and description are to be regarded as illustrative in nature and not as restrictive.

BRIEF DESCRIPTION OF THE DRAWING

FIG. 2 is a front plan view of the clamp in accordance with the present invention;

FIG. 3 is a cross-sectional view taken along the line 3—3 of FIG. 2 to depict the mounting arrangement of the stationary first fingers to the clamp;

FIG. 4 is a sectional view taken along the line 4—4 of FIG. 2 to depict the mounting arrangement of the movable second fingers to the clamp;

FIG. 5 is a sectional view taken along the line 5—5 of FIG. 2;

BEST MODE FOR CARRYING OUT THE INVENTION

Figure 1:
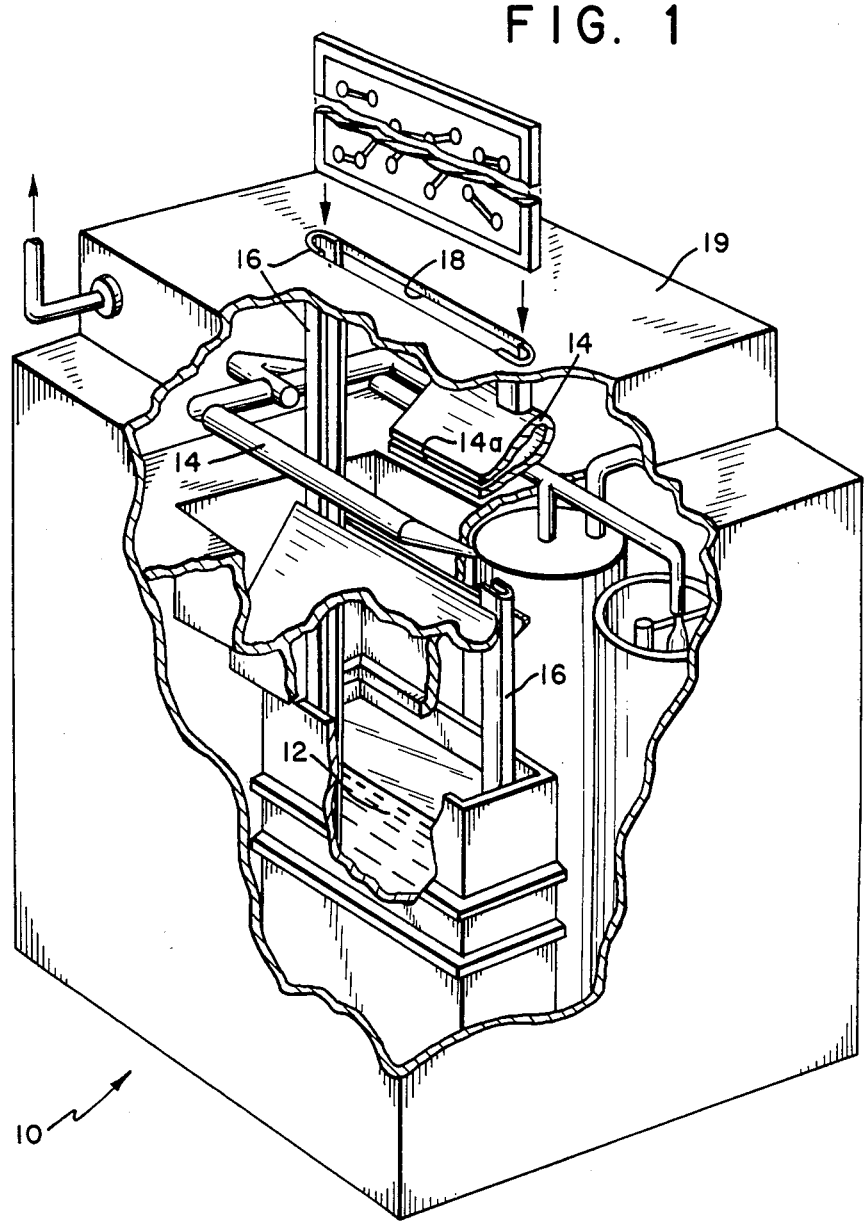
FIG. 1 is an illustration of a solder coating machine containing a liquid solder bath into which printed circuit boards may be dipped with the clamp in accordance with the present invention.
Figure 6:
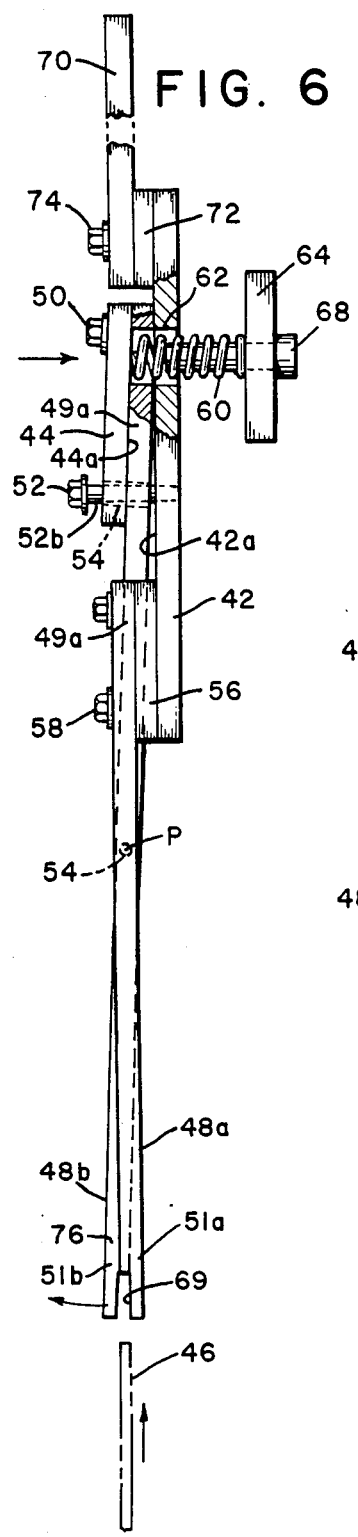
FIG. 6 is a sectional view similar to FIGS. 3 and 4 and taken along the line 6—6 of FIG. 2, depicting the first and second fingers in an open, unclamped position under the influence of an applied actuating force.
Figure 7:
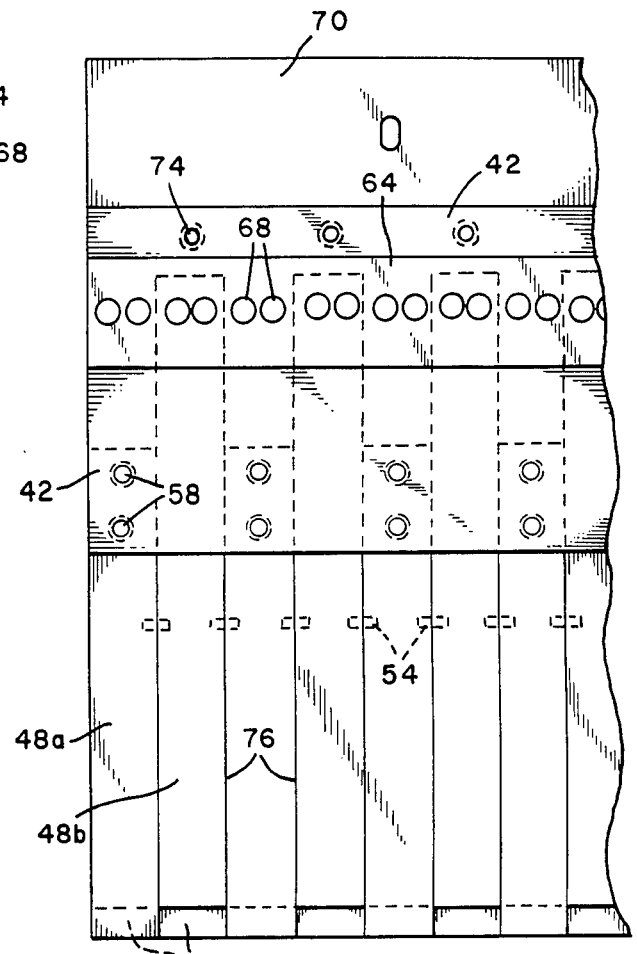
FIG. 7 is a partial rear view of the clamp in FIG. 2.

Referring to FIGS. 2-6, clamp 40 of the present invention comprises a pair of first and second mounting plates 42,44 having a length L less than the corresponding length of inlet 18 of housing top 19 (FIG. 1) through which the clamp carrying printed circuit board (PCB) 46 is inserted into solder bath 12 by means of a counterbalanced structural tubing frame assembly (not shown) to coat the PCB with solder. In accordance with the unique features set forth below, one or more PCBs 46 are clamped together along the length L of clamp 40 by means of first and second clamping fingers 48a, 48b respectively mounted to plates 42,44 in coplanar, interdigitated relationship to each other. More specifically, as depicted in FIGS. 4 and 6, the movable second clamping fingers 48b are mounted respectively at upper ends 49a thereof to the inner surface 44b of movable second mounting plate 44 with bolts 50 and 52 and are pivotally connected to stationary first fingers 48a by means of pivot pins 54 defining pivot axis P (FIG. 5) intermediate opposite ends of the fingers. Upper ends 49a of first fingers 48a are mounted to the lower end of stationary first plate 42 with spacers 56 and bolts 58 in spaced relationship to the second mounting plate so that pivot axis P extends in a plane both parallel to and spaced from the plane containing the inner surface 42a of the first mounting plate by at least the thickness of the spacers.

The upper end of second mounting plate 44 is spaced from first plate 42 by means of springs 60 respectively extending through holes 62 to bear against inner surface 44a and a spring support plate 64 in an unstressed normal state. The spring support plate 64 is mounted parallel and in spaced relation to the outer surface of first plate 42 by means of bolts 66 (FIG. 3). Each spring 60 is precisely located in contact with spring support plate 64 by means of roll pins 68 having one end tightly fitted into the spring support plate and an opposite end terminating within holes 62.

In operation, an actuating force F applied to the outer surface of second mounting plate 44 urges the upper end of the second mounting plate towards first mounting plate 42 against spring bias. Because pivot axis P is spaced from the plane of first mounting plate 42 by spacers 56, the second fingers 48b pivot about axis P with respect to first fingers 48a. Distal ends 51a and 51b of first and second fingers 48a, 48b, respectively, are thus spread apart from each other due to a "scissoring" effect allowing insertion of PCB 46 between notched ends 69 of the spread apart fingers.

Upon removal of actuating force F, second mounting plate 44 is returned by the compressed spring 60 into its normal position generally parallel to first mounting plate 42. As second mounting plate 44 returns to its normal position (FIG. 4) the distal ends 51b of second fingers 48b pivot back towards first fingers 48a. The restoration force of springs 60 is transmitted as a clamping force to the notches 69 of fingers 48a, 48b to thereby clamp PCB 46 in secure position.

A clamp support plate 70 projects upwardly from first mounting plate 42 and is fixed to the upper end thereof by means of spacers 72 and bolts 74. Clamp support plate 70 is thus coplanar with fingers 48a, 48b and is attached to the counterbalanced structural tubing frame assembly to raise and lower clamp 40 into and out of solder bath 12.

With reference to FIGS. 2 and 3, a pair of laterally spaced springs 60 are provided on either side of each movable finger 48b to maintain first plate 42 in uniformly spaced parallel relation to second plate 44 along the entire length of clamp 40. Spacers 56 are disposed only between first mounting plate 42 and stationary fingers 48a to avoid interfering with the pivot movement of second fingers 48b during application of actuating force F.

With reference to FIG. 4, the lower bolts 52 cooperating with bolts 50 to secure movable fingers 48b to plate 44 each include a threaded distal portion 52a passing through a tapped hole 53 formed in first plate 42. As depicted in FIG. 6, intermediate portion 52b slides through hole 54 in movable plate 44 as the movable plate is urged under actuating force F towards first plate 42. Bolt 52 thus mounts plate 44 to plate 42 but does not impede pivotal movement of the plate 44 and movable fingers during application of force F.

The ratio of distance $D_1$ (FIG. 3 only) as measured between the central axes of springs 60 and pivot axis P relative to distance $D_2$ as measured between the pivot axis and an axis passing through the center of notches 69 is selected based upon a number of design considerations. For example, a small distance $D_2$ and a large distance $D_1$ will result in a large clamping force applied to PCB 46 by notches 69 while also allowing the actuators (not shown) applying force F to plate 44 to be relatively small and therefore of reduced cost. However, it is also important to maintain pivot axis P above the level of air knives 14 to prevent contamination by flux and solder particles as clamp 40 descends into lowermost position to dip PCB 46 into bath 12. Still another factor to be considered is the height of air knives 14 relative to the level of solder in bath 12 and the spacing between the air knives. In other words, moving pivot axis P towards notches 69 would cause the air knives to be spaced farther apart from each other whereas it is desirable to maintain the air knives as close as possible to both surfaces of PCB 46. I have found a preferred ratio of $D_1:D_2$ to be approximately 1:1.

Fingers 48a, 48b are preferably made of titanium to prevent solder from sticking to the fingers. In addition, the feature of forming clamp 40 with interdigitating fingers 48a, 48b reduces the tendency of solder to accumulate on and between the fingers to prevent the clamp from operating since the only point of contact between adjacent fingers occurs at thin lateral edges 76 preferably in slight contact with each other. These edges 76 between adjacent fingers 48a, 48b effect a wiping action when fingers 48b pivot with respect to fingers 48a to prevent solder from bridging between adjacent fingers.

As depicted in FIG. 5, pivot axis P is preferably defined by a series of pivot pins 54 respectively disposed in blind cylindrical holes 78 formed in lateral facing edges 76 of adjacent fingers in coaxial relation to each other. This preferred arrangement minimizes the tendency of pins 54 to become contaminated with flux and solder particles.

The counterbalanced structural tubing frame assembly connected to clamp support plate 70 is a known mechanism and is connected to a pneumatic cylinder (not shown) to raise and lower clamp 40 into and out of machine 10. The pneumatic cylinder is controlled with an air valve and a solid state control mechanism as known in the art that positions the frame at one of two locations as defined by position limit switches.

The actuators (not shown) for applying actuating force F to pivot movable plate 44 and fingers 48b about pivot axis P are preferably a pair of pneumatic cylinders with piston rods arranged to contact plate 44 at opposite ends thereof to transmit equal force along the entire length of clamp 40. The lines of applied force F exerted by each piston rod is essentially in line with the axes of springs 60.

Although clamp 40 of the invention is disclosed for use with a solder coating machine 10, it will be obvious to one of ordinary skill in the art that the clamp may also be used during other steps involved in the manufacture of PCBs. In addition, clamp 40 according to the present invention may be used for clamping other types of boards or elongated objects to perform different manufacturing steps involving clamping, all without departing from the scope of the present invention.

The foregoing description of a preferred embodiment of the present invention has been presented for purposes of illustration and description. It is not intended to be exhaustive or to limit the invention to the precise form disclosed, and obviously many modifications and variations are possible in light of the above teachings. The embodiment was chosen and described in order to best explain the principles of the invention and its practical application to thereby enable others skilled in the art to best utilize the invention and various embodiments and with various modifications as are suited to the particular use contemplated. It is intended that the scope of the invention be defined by the claims appended hereto.

I claim:

1. A clamp for dipping a printed circuit board (PCB) into a solder bath, comprising:
   (a) a first plate;
   (b) series of first clamping fingers fixed to the first plate laterally spaced and coplanar with each other;
   (c) a movable second plate;
   (d) means for mounting the first plate to the second plate in spaced, substantially parallel relationship to each other, said mounting means including spring means for biasing the second plate from the first plate;
   (e) a series of second clamping fingers fixed to the second plate to extend respectively between and coplanar with the first clamping fingers; and
   (f) means for pivotally securing the first clamping fingers to the second clamping fingers, movement of the second plate in a direction perpendicular to the plane of the first plate under the influence of an applied actuating force causing the second fingers to pivot out of the plane of the first fingers enabling insertion of the PCB between the first and second fingers, whereby removal of the actuating force allowing the second plate to move under spring bias causes the second fingers to pivot towards the first fingers and thereby clamp the PCB therebetween.

2. The clamp of claim 1, wherein said mounting means includes a spring support plate and screw means for connecting the support plate to the first plate in substantially parallel relationship to each other, said support plate being separated from the second plate by said first plate, said spring means including a spring extending through the first plate, one end of the spring abutting against the spring support plate, an opposite end of the spring abutting against the second plate, whereby application of the actuating force moves the second plate towards the first plate against spring bias.

3. The clamp of claim 2, wherein each second finger is secured at one end thereof to a surface of the second plate facing the first plate.

4. The clamp of claim 3, further including spacer means secured to a surface of the first plate facing the second plate, each first finger being secured at one end thereof in overlapping relation to the spacer means so that the first and second fingers are generally coplanar with each other and project in a first direction away from the first and second plates with distal ends thereof opposite said one end defining board clamping surfaces.

5. The clamp of claim 4, wherein said pivot means includes a plurality of pivot pins respectively received in opposing first and second transverse holes formed respectively in a lateral edge of intermediate portions of the first and second fingers facing each other, said pivot pins jointly defining a pivot axis lying transverse to longitudinal axes at said first and second fingers.

6. The clamp of claim 4, further including a connecting plate attached to the first plate and projecting in a direction opposite the first direction and thereby away from the first and second fingers, said connecting plate being connectible to clamp moving means.

7. The clamp of claim 6, wherein said connecting plate is generally coplanar with said first and second fingers.

8. The clamp of claim 1, wherein said first and second fingers include solder resistant material at clamping ends thereof.

9. The clamp of claim 8, wherein said solder resistant material is titanium.

10. A clamp, comprising:
(a) a plurality of first fingers;
(b) a plurality of second fingers;
(c) means for supporting said first and second fingers respectively at one end thereof in interdigitated coplanar and pivotal relationship to each other, distal ends of said first and second fingers being generally in alignment with each other; and
(d) means for pivoting said second fingers relative to the first fingers intermediate the opposte ends of the fingers to alternately displace the distal ends of said first and second fingers from each other in a direction generally perpendicular to the plane of said first and second fingers to allow for insertion and clamping of a PCB between said distal ends.

11. The clamp of claim 10, wherein said supporting means and said moving means are respectively and substantially entirely located at ends of said first and second fingers opposite said distal ends.

12. The clamp of claim 11, further including means for connecting said clamp to a clamp moving means, said clamp connecting means extending from the support means in a direction opposite the direction in which said distal ends extend.

13. Apparatus for coating a printed circuit board (PCB) and the like with solder, comprising in combination:
(a) a housing having an opening therein
(b) means for maintaining a liquid solder bath within said housing;
(c) a clamp engageable with an edge of the PCB for dipping same into the liquid solder, said clamp including:
(i) a plurality of first fingers;
(ii) a plurality of second fingers;
(iii) means for supporting said first and second fingers respectively at one end thereof in interdigitated coplanar and pivotal relationship to each other, distal ends of said first and second fingers being generally in alignment with each other; and
(iv) means for pivoting said second fingers relative to the first fingers intermediate the opposite ends of the fingers to alternately displace the distal ends of said first and second fingers from each other in a direction generally perpendicular to the plane of said first and second fingers to allow for insertion and clamping of a PCB between said distal ends;
(d) means for moving said clamp carrying said PCB into and out of said apparatus through said opening; and
(f) a plurality of stationary hot air knives positioned above said bath means for directing hot gas jets onto the PCB to sweep off undesired solder while leaving an optimum thickness solder layer intact; said first and second fingers of said clamp being of sufficient length and thinness to pass between said hot air knives while carrying the PCB in clamping engagement without disrupting the flow of hot gas against the PCB.

14. The apparatus of claim 13 which includes a guideway means extending from said opening formed in the housing for guiding the PCB into the liquid.

* * * * *